(12) United States Patent
Kajihara et al.

(10) Patent No.: US 9,109,285 B2
(45) Date of Patent: Aug. 18, 2015

(54) FILM-FORMING APPARATUS

(71) Applicant: CANON ANELVA CORPORATION, Kawasaki-shi (JP)

(72) Inventors: Yuji Kajihara, Fuchu (JP); Yasushi Yasumatsu, Inagi (JP); Kazuya Konaga, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 130 days.

(21) Appl. No.: 14/107,110

(22) Filed: Dec. 16, 2013

(65) Prior Publication Data

US 2014/0102889 A1    Apr. 17, 2014

Related U.S. Application Data

(63) Continuation of application No. PCT/JP2012/003528, filed on May 30, 2012.

(30) Foreign Application Priority Data

Sep. 9, 2011   (JP) ................ 2011-196790

(51) Int. Cl.
*C23C 14/34* (2006.01)
*H01J 37/34* (2006.01)
*C23C 14/56* (2006.01)

(52) U.S. Cl.
CPC .............. *C23C 14/34* (2013.01); *C23C 14/3464* (2013.01); *C23C 14/564* (2013.01); *H01J 37/3441* (2013.01); *H01J 37/3447* (2013.01)

(58) Field of Classification Search
CPC .. C23C 14/564; C23C 14/34; C23C 14/3464; H01J 37/3441; H01J 37/3447
USPC .................................................. 204/298.11
See application file for complete search history.

(56) References Cited

U.S. PATENT DOCUMENTS 3,985,635 A    10/1976  Adam et al.
2009/0139865 A1  6/2009  Nomura et al.
(Continued)

FOREIGN PATENT DOCUMENTS

CN   101469406 A   7/2009
JP   49-114585   11/1974
(Continued)

OTHER PUBLICATIONS

Chinese Office Action issued in corresponding application No. 201280031319.X on Feb. 12, 2015—17 pages including English translation.
(Continued)

*Primary Examiner* — Rodney McDonald
(74) *Attorney, Agent, or Firm* — Fitzpatrick, Cella, Harper & Scinto

(57) ABSTRACT

An apparatus includes a plurality of target electrodes having attachment surfaces, a substrate holder, a first shutter member provided between the plurality of target electrodes and the substrate holder and having a plurality of openings, a first separating portion disposed between the openings of the first shutter member on its surface of the target electrode side, and a second separating portion disposed between the first shutter member and the target electrodes. The first shutter member is driven so as to bring the first separating portion and the second separating portion toward each other so that an indirect path can be formed between the first separating portion and the second separating portion, and driven so as to bring the first separating portion and the second separating portion away from each other so that the first shutter plate can be rotated.

6 Claims, 9 Drawing Sheets

(56) References Cited

U.S. PATENT DOCUMENTS

| | | |
|---|---|---|
| 2009/0166195 A1 | 7/2009 | Kobayashi et al. |
| 2009/0211897 A1 | 8/2009 | Tsunekawa |
| 2010/0206715 A1 | 8/2010 | Hiromi et al. |
| 2010/0243438 A1 | 9/2010 | Yamaguchi et al. |
| 2011/0223346 A1 | 9/2011 | Kitada et al. |
| 2014/0034489 A1 | 2/2014 | Kajihara et al. |
| 2014/0054167 A1 | 2/2014 | Kajihara et al. |

FOREIGN PATENT DOCUMENTS

| | | |
|---|---|---|
| JP | 63-255368 A | 10/1988 |
| JP | 1-94454 U | 6/1989 |
| JP | 10-158830 A | 6/1998 |
| JP | 2002-088471 A | 3/2002 |
| JP | 2003-141719 A | 5/2003 |
| JP | 2009-221595 A | 1/2009 |
| JP | 2009-155706 A | 7/2009 |
| JP | 2010-209463 A | 9/2010 |
| JP | 2011-001597 A | 1/2011 |
| WO | 2010-038421 A1 | 4/2010 |

OTHER PUBLICATIONS

Office Action issued in Taiwanese Patent Application No. 101123887, dated Apr. 7, 2014 (3 pages).

F I G. 2
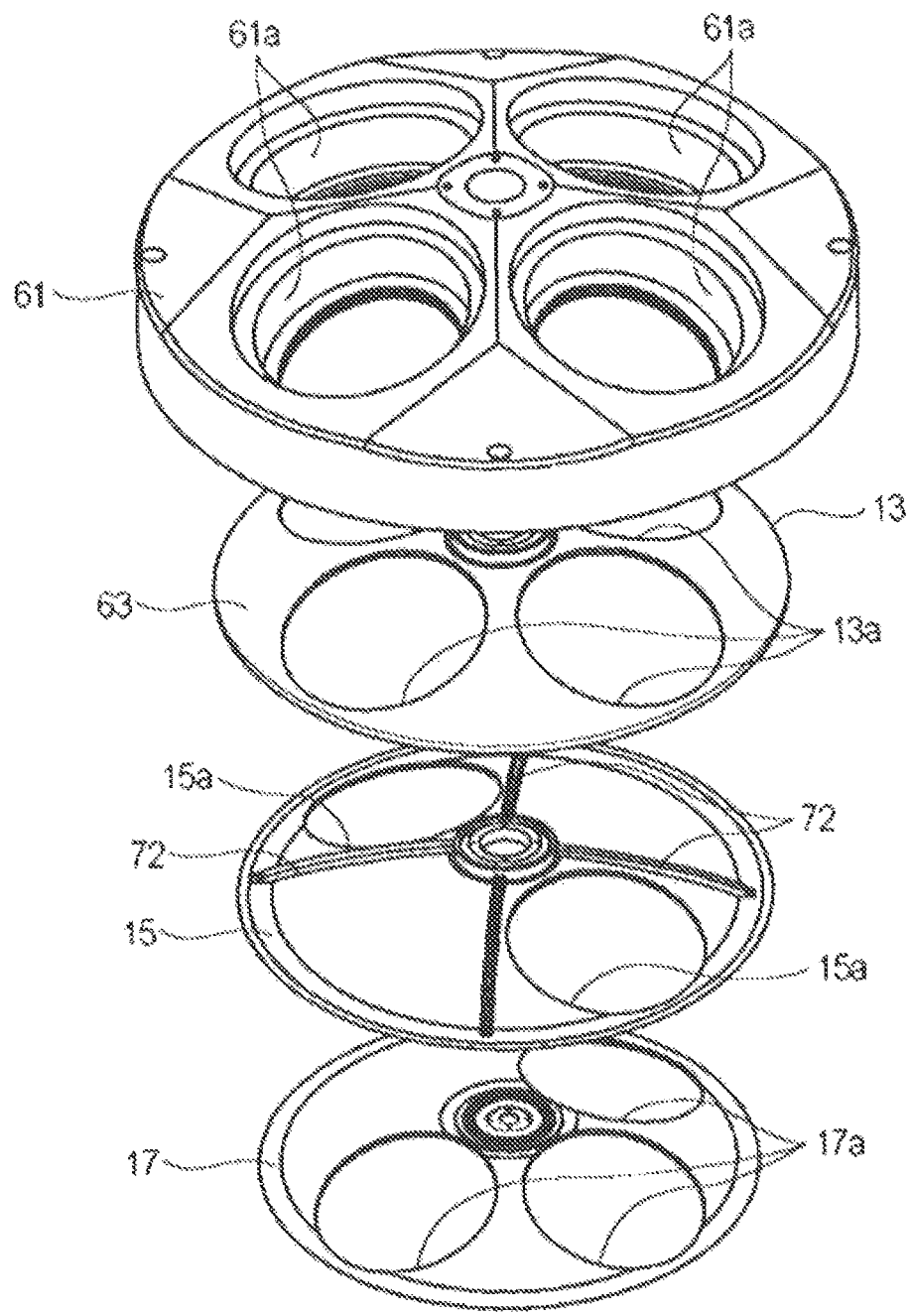

FILM-FORMING APPARATUS

This application is a continuation of International Patent Application No. PCT/JP2012/003528 filed on May 30, 2012, and claims priority to Japanese Patent Application No. 2011-196790 filed on Sep. 9, 2011, the entire content of both of which is incorporated herein by reference.

BACKGROUND OF THE INVENTION

1. Field of the Invention

The present invention relates to a film-forming apparatus, and specifically to a technique for presenting and reducing contamination in a multi-target sputter film-forming apparatus that includes a plurality of target electrodes made of different materials in a single chamber, for example, and that terms a multi-layered film by sputtering, using a rotary shutter apparatus.

2. Description of the Related Art

A multi-target sputter film-forming apparatus (for example, Japanese Patent Laid-Open No. 2011-001597) can form a required multi-layered film in a single film-forming chamber by sputtering continuously without interruption from the bottom layer to the top layer on a substrate.

In order to form a multi-layered film by sputtering, in the film-forming apparatus of Japanese Patent Laid-Open No. 2011-001597, in a single chamber, a plurality of targets made of different materials are disposed on a ceiling portion of the chamber, or in other words, in a space above the substrate on which a film is to be formed, and a shutter apparatus for selecting a target to be used in sputter film formation is also provided. The shutter apparatus has a double shutter structure including shutter plates that rotate independently of each other. Each of the two shutter plates has a required number of openings formed in predetermined positions so that a selected target can be viewed from the substrate side.

With the rotary shutter apparatus, targets made of materials not to be used in film formation are shielded, and targets made of materials to be used in sputter film formation become visible from a substrate through the openings. The rotary shutter apparatus includes two shutter plates having a substantially circular shape as viewed from the substrate, and the two shutter plates are configured to rotate independently of each other. To select a target to be used in sputter film formation, each shutter plate is rotated by the rotary shutter apparatus such that a target made of a material that needs to be used in film formation faces the substrate through the opening.

In the case of sputter film formation in which a plurality of targets made of different, materials to be used in film formation are selected in a specified order, if contamination occurs between the targets, the performance of the formed film may be low. There is a need for a technique for reliably preventing the occurrence of contamination in order to deposit a high-performance multi-layered film on a substrate.

In the case of sputter film formation in which a plurality of targets made of different materials to be used in film formation are selected in a specific order, if contamination occurs between the targets, the performance of the formed film may be low. There is a need for a technique for reliably preventing the occurrence of contamination in order to deposit a high-performance multi-layered film on a substrate.

SUMMARY OF THE INVENTION

In view of the above-described problem, the present invention provides a film-forming apparatus that includes a plurality of targets in a single chamber so as to form a multi-layered film by sputtering and in which a target is selected with a rotary shutter apparatus, the film-forming apparatus being configured such that the occurrence of contamination is reduced between the targets.

A film-forming apparatus according to the present invention is a film-forming apparatus including: a plurality of target electrodes respectively having attachment surfaces to which targets can be attached; a substrate holder configured to hold a substrate at a position opposing the plurality of target electrodes, a first shutter member rotatably provided between the plurality of target electrodes and the substrate holder and having a plurality of openings that oppose the attachment surfaces when the first shutter member is rotated; a first separating portion disposed between the openings of the first shutter member on one of two surfaces of the first shutter member that is on the target electrode side; and a second separating portion disposed between the first shutter member and the target electrodes, wherein the first shutter member is driven so as to bring the first separating portion and the second separating portion toward each other so that an indirect path can be formed between the first separating portion and the second separating portion, and driven so as to bring the first separating portion and the second separating portion away from each other so that the first shutter plate can be rotated.

Other features and advantages of the present invention will become apparent from the following description with reference to the accompanying drawings. Note that in the accompanying drawings, the same reference numerals are given to the same or similar components.

BRIEF DESCRIPTION OF DRAWINGS

The accompanying drawings are included in the specification, constitute a part of the specification, show embodiments of the present invention, and are used to illustrate the principle of the present invention together with the description in the specification.

FIG. 2 depicts a perspective view showing members constituting a shutter apparatus according to the first embodiment of the present invention;

DESCRIPTION OF THE EMBODIMENTS

Hereinafter, preferred embodiments of the present invention will be described with reference to the accompanying drawings. The members, arrangement and the like described below are merely examples embodying the invention and are not intended to limit the scope of the present invention, and thus various modifications can be made in accordance with the spirit of the present invention. The application of the film-forming apparatus according to the present invention is not limited to a sputtering apparatus, and the present invention is applicable to various PVD apparatuses in which a vapor deposition material can be selected with a shutter apparatus in a vacuum container.

First Embodiment

Figure 1:
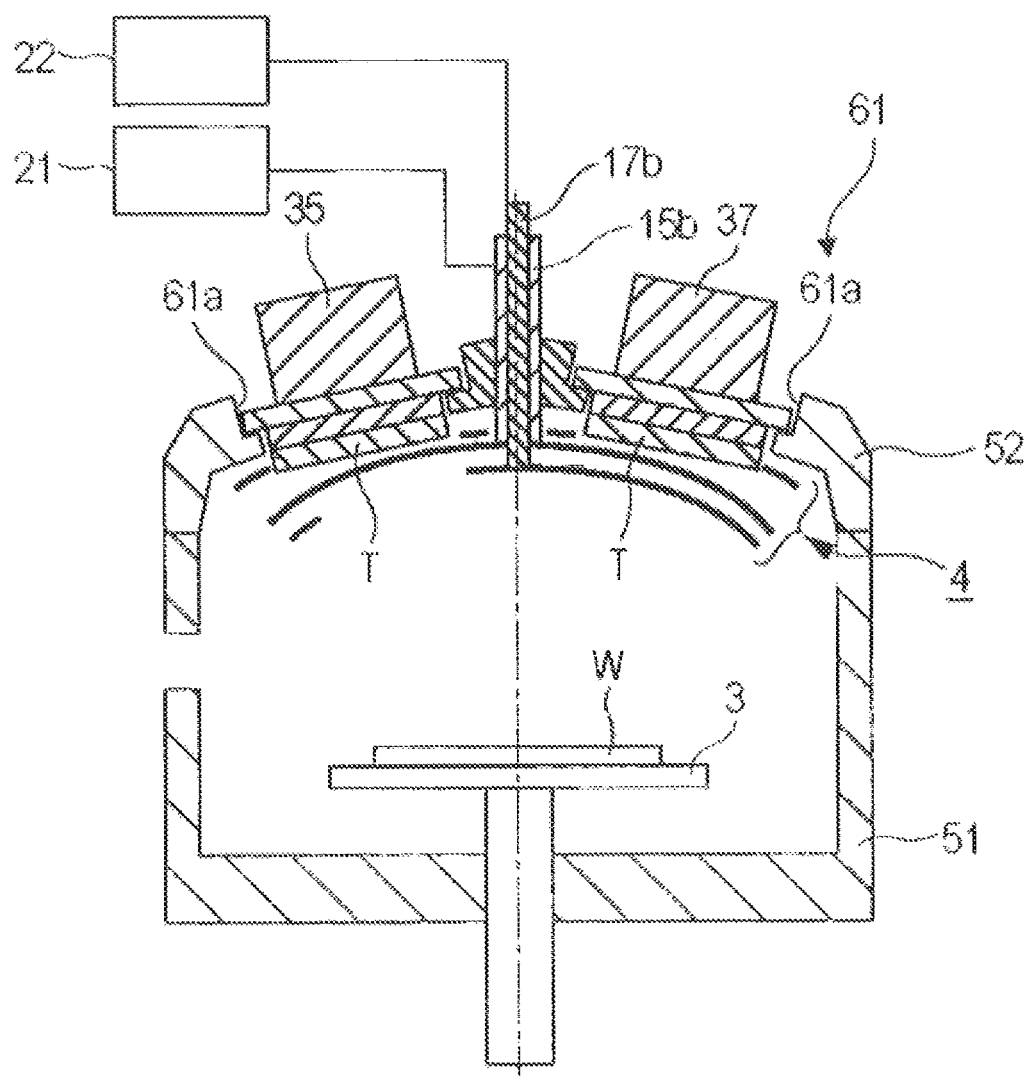
FIG. 1 depicts a vertical cross-sectional view of a film forming apparatus according to a first embodiment of the present invention.

A film-forming apparatus according to a first embodiment of the present invention will be described with reference to FIGS. 1 to 6. FIG. 1 is a vertical cross-sectional view of a film-forming apparatus according to a first embodiment of the present invention. A film-forming apparatus 1 is a sputter film-forming apparatus including a vacuum container 51 internally provided with four target electrodes 35 to 38 (36 and 37 are not shown), a substrate holder 3 for holding a substrate W and a shutter apparatus 4 that can expose a given target T to the substrate W. A shutter apparatus 4 is disposed at a position between the target T and the substrate W.

In FIG. 1, an evacuation unit for evacuating the inside of the film-forming apparatus 1 into a required vacuum state, a unit for supplying power to the target electrodes 35 to 38, a substrate conveying apparatus for changing the substrate W on the substrate holder 3 via a gate valve GV, and a unit for generating plasma such as a process gas introducing unit are not illustrated.

The substrate holder 3 is rotatably provided at the center of a bottom portion of the film-forming apparatus 1, and is capable of holding the substrate W in a horizontal state. The substrate W is held in a rotating state while sputter film formation is performed on the substrate W. The four target electrodes 35 to 38 are attached to a ceiling portion 52 of the vacuum container 51 of the film-forming apparatus 1 at an inclination.

A target electrode holder 61 is provided on the ceiling portion 52 constituting an upper portion of the vacuum container 51. The target electrode holder 61 is a member having four attachment portions 61a for holding target electrodes. The target electrode holder 61 also functions as a lid of the vacuum container 51. In the present embodiment, the attachment portions 61a are unitary with the ceiling portion 52, but the attachment portions 61a may be provided to a portion of the vacuum container 51.

The target electrodes held by the attachment portions 61a can each hold a target T to which a given film-forming substance for film formation processing is bonded such that the target T faces in the direction of the substrate W. The portion of each target electrode where a target T is held is referred to as the target attachment surface.

FIG. 1 shows only two target electrodes located in a cross section. A target T can be disposed on each of the inclined target electrodes 35 to 38 such that the target T opposes the upper surface of the substrate W horizontally located below the target electrodes. A film-forming material to be used in film formation processing is bonded to the target T.

As used herein, the state in which the target T opposes the substrate encompasses a state in which the target electrode is oriented toward the periphery of the substrate, and a state as shown in FIG. 1 in which a sputter surface of the target T is inclined toward the substrate 34. Examples of the multi-layered film device to be formed on the substrate include LEDs, MRAMs, TMR heads, advanced (improved) GMRs and the like. The type of targets mounted on the target electrodes of the film-forming apparatus 1 can of course be changed according to the film configuration of the multi-layered film device to be formed.

Figure 3:
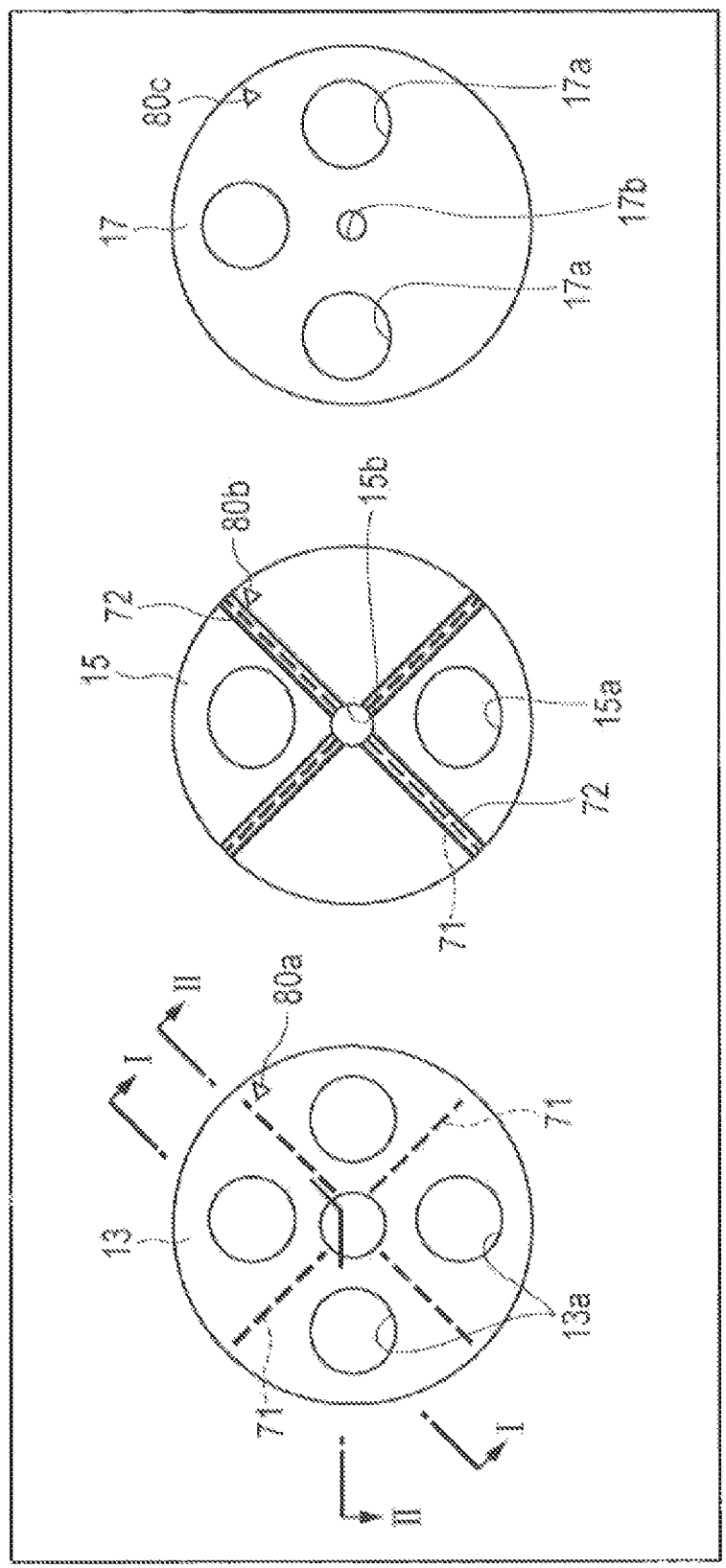
FIG. 3 depicts a schematic view showing members constituting the shutter apparatus according to the first embodiment of the present invention, as viewed from above.

A structure of the shutter apparatus 4 will now be described with reference to FIGS. 2 to 6. FIG. 2 is a perspective view showing an upper shield plate 13, a first shutter plate 15 and a second shutter plate 17 from among members constituting the shutter apparatus 4. FIG. 3 is a schematic view showing the upper shield plate 13, the first shutter plate 15 and the second shutter plate 17 as viewed from above, from among members constituting the shutter apparatus 4. In FIG. 3, in order to clearly show the positional relationship between separating portions (second separating portions) 71 and separating portions (first separating portions) 72 as viewed from above, the separating portions 71, which actually cannot be seen from above, are indicated by broken lines.

The shutter apparatus 4 includes, as primary constituent components, the upper shield plate (shield member) 13, the first shutter plate (first shutter member) 15 and the second shutter plate (second shutter member) 17. The first shutter plate 15 and the second shutter plate 17 are configured as shutter plates of the double rotary shutter. By the shutter apparatus 4 positioning each shutter plate (15 and 17) in a predetermined position, one of the targets T respectively mounted on the four target electrodes 35 to 38 to be used in sputter film formation can be caused to face the substrate W.

The upper shield plate 12 is a member that is attached to the target electrode holder 61 and that prevents adhesion of a film to the target electrode holder 61. In the case of a configuration in which the upper shield plate 13 is not disposed, the substrate-side surface of the target electrode holder 61 opposes the first shutter plate 15. The first shutter plate 15 and the second shutter plate 17 are configured as shutter plates of the double rotary shutter. It should be noted that all of the upper shield plate 13, the first shutter plate 15 and the second shutter plate 17 have upwardly bulged and curbed shapes.

The upper shield plate (shield member) 15 is an adhesion preventing shield plate that is provided on the substrate holder 3 side of the target electrode holder 61 and can prevent the substances sputtered from the targets T from adhering to the target electrode holder 61. As described above, the target electrode holder 61 has four attachment portions 61a formed therein. Each of the attachment portions 61a holds a target electrode C. Each target electrode C has a surface to which a target T can be attached (attachment surface), and the upper shield plate 13 has openings 13a formed in areas respectively opposing the attachment surfaces of the target electrodes. On one of two surfaces of the upper shield plate 13 that opposes the first shutter plate 15, a separating portion 71 is provided between two openings 13a of the upper shield plate 13. The separating portions 71 can be, for example, protruding portions.

The first shutter plate (first shutter member) 15 is a shutter plate that is rotatably provided on the substrate holder 3 side of the upper shield plate 13, and the rotation angle of the first shutter plate 15 can be controlled by rotating a rotation shaft 15*b*. The first shutter plate 15 has openings 15*a* formed in areas that oppose the target attachment surfaces of two target electrodes. The two openings 15*a* of the first shutter plate 15 are formed in positions symmetric about the rotation shaft 15*b*.

Figure 6:
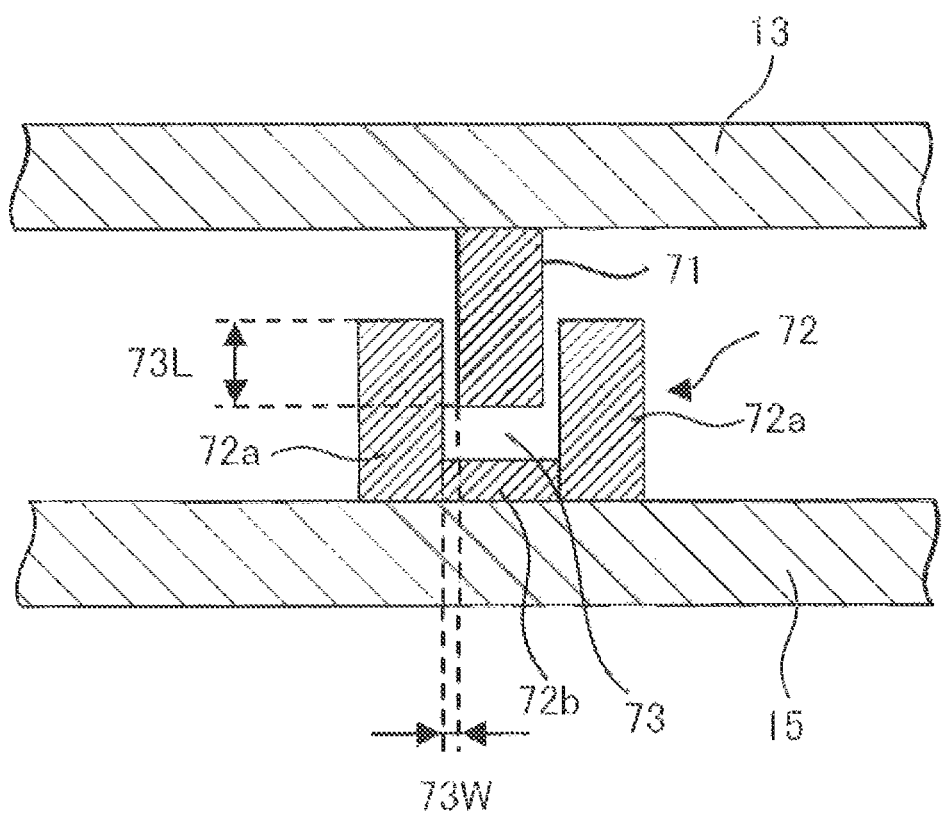
FIG. 6 depicts a cross-sectional view of an indirect path portion formed in the shutter apparatus according to the first embodiment of the present invention.

The rotation shaft 15*b* is driven by a first driving apparatus 21. The first driving apparatus 21 is configured to rotate and move the rotation shaft 15*b* up and down relative to the target electrode holder 61, and thus the first shutter plate 15 can be rotated and moved up and down via the rotation shaft 15*b*. The first driving apparatus 21 may include, for example, a motor for rotating and moving the rotation shaft 15*b* up and down, and a controller for controlling the motor. The first driving apparatus 21 can control the distance between the upper shield plate 13 and the first shutter plate 15 by moving the rotation shaft 15*b* in up and down directions. On one of two surfaces of the first shutter plate 15 that opposes the upper shield plate 13, separating portions 72 are provided between two openings 15*a* of the first shutter plate 15. The separating portions 72 may be, for example, U-shaped portions. Each U-shaped portion may include, as shown in FIG. 6, two protruding portions 72*a* (double protruding portions 72*a*) that are disposed in parallel and a bottom portion 72*b* that is sandwiched by the two protruding portions 72*a*.

The second shutter plate (second shutter member) 17 is a shutter plate that is rotatably provided on the substrate holder 3 side of the first shutter plate 15, and the rotation angle of the second shutter plate 17 can be controlled by rotating a rotation shaft 17*b*. The rotation shaft 15*b* and the rotation shaft 17*b* are configured so as to be capable of being controlled to rotate independently of each other. The second shutter plate 17 has openings 17*a* formed in areas respectively opposing the target attachment surfaces of three target electrodes. Also, among the three openings 17*a* of the second shutter plate 17, two openings in positions symmetric about the rotation shaft 17*b* are formed such that they can be disposed so as to oppose the two openings 15*a* of the first shutter plate 15.

The number of openings 17*a* of the second shutter plate 17 is not limited to three, and the second shutter plate 17 preferably has a number of openings greater than or equal to the number of openings 15*a* of the first shutter plate 15. Likewise, the number of openings 15*a* of the first shutter plate 15 may be more than three.

The rotation shaft 17*b* is driven by a second driving apparatus 22. The second driving apparatus 22 is configured to rotate and move the rotation shaft 17*b* up and down relative to the target electrode holder 61, and thus the second shutter plate 17 can be rotated and moved up and down via the rotation shaft 17*b*. The second driving apparatus 22 may include, for example, a motor for rotating and moving the rotation shaft 17*b* up and down, and a controller for controlling the motor. When the rotation shaft 17*b* and the rotation shaft 15*b* are simultaneously moved up and down at the same speed, the gap between the first shutter plate 15 and the second shutter plate 17 does not change.

In the present embodiment, the separating portions 71 are four linear portions protruding from the upper shield plate 15 toward the first shutter plate 15. Each separating portion 71 is disposed at a position between adjacent openings 13*a*. In other words, a plurality of separating portions 71 are disposed such that each opening 13*a* is sandwiched by two separating portions 71. The plurality of separating portions 71 extend radially from the center of the upper shield plate 13. In the present embodiment, the separating portions 71 are attached to the upper shield plate 13, but in the case of a configuration without the upper shield plate 13, the separating portions 71 may be attached to the container 51 or the target electrode holder 61. Also, the separating portions 71 may be provided so as to surround each opening 13*a* so that an indirect path can be formed around the entire circumference of the opening 13*a*.

As described above, the separating portions 72 can each include double protruding portions 72*a* protruding from the first shutter plate 15 toward the upper shield plate 13 (target electrode side). The separating portions 72 are disposed on opposite circumferential sides of each opening 15*a*. In other words, each opening 15*a* is sandwiched by two separating portions 72. The double protruding portions 72*a* may be configured by, for example, disposing two plate-like members in parallel, by plastically deforming a single plate-like member so as to have a U-shaped cross section, or by any other methods.

In the present embodiment, a plurality of separating portions 72 are attached so as to extend radially from the center of the rotation shaft 15*b* of the first shutter plate 15, but the separating portions 72 may be provided so as to surround each opening 15*a* so that an indirect path can be formed around the entire circumference of the opening 15*a*.

By raising the first shutter plate 15 such that the protruding portion constituting a separating portion 71 is inserted into the gap between the double protruding portions 72*a* included in a separating portion 72, an indirect path can be formed by the separating portion 71 and the separating portion 72. In FIG. 3, reference numerals 80*a*, 80*b* and 80*c* are marks indicating the reference position of the rotation angle of the first shutter plate 15 and the second shutter plate 17.

Figure 4A:
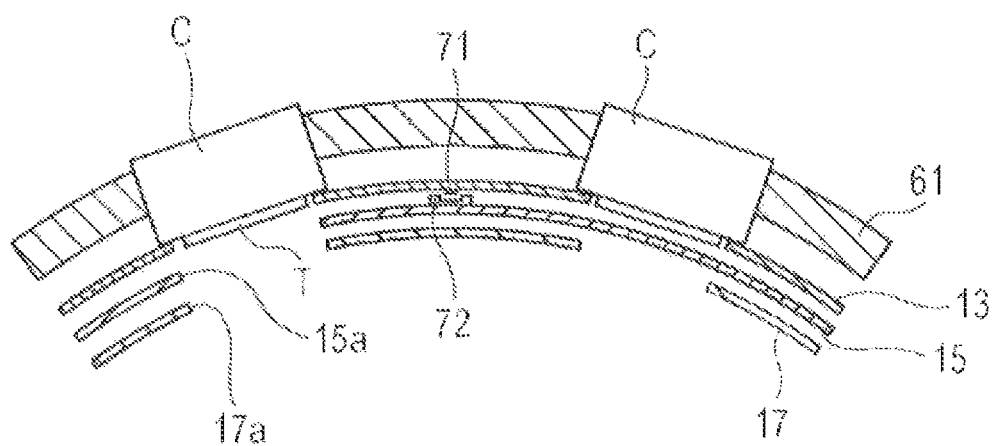
FIG. 4A depicts a cross-sectional view taken along the line I-I of FIG. 3.
Figure 4B:
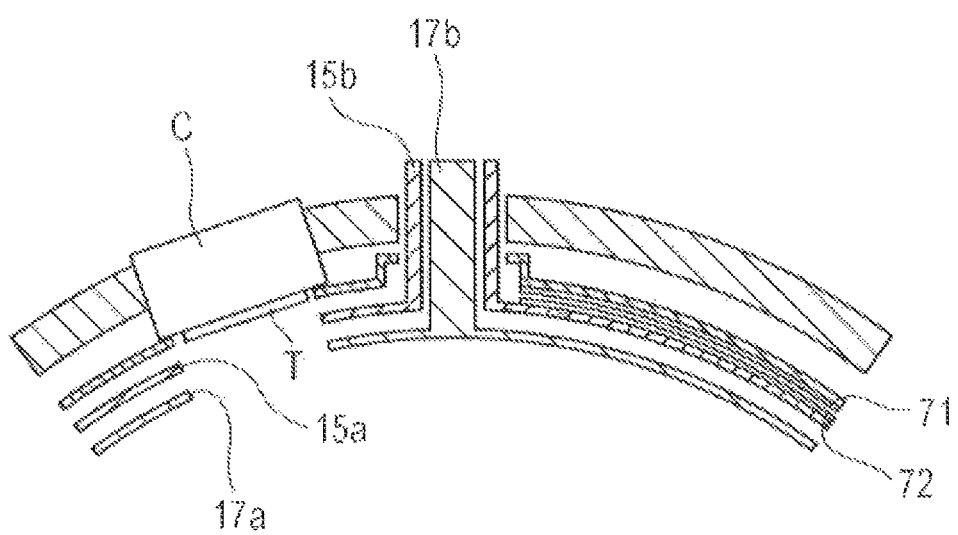
FIG. 4B depicts a cross-sectional view taken along the line II-II of FIG. 3.
Figure 5:
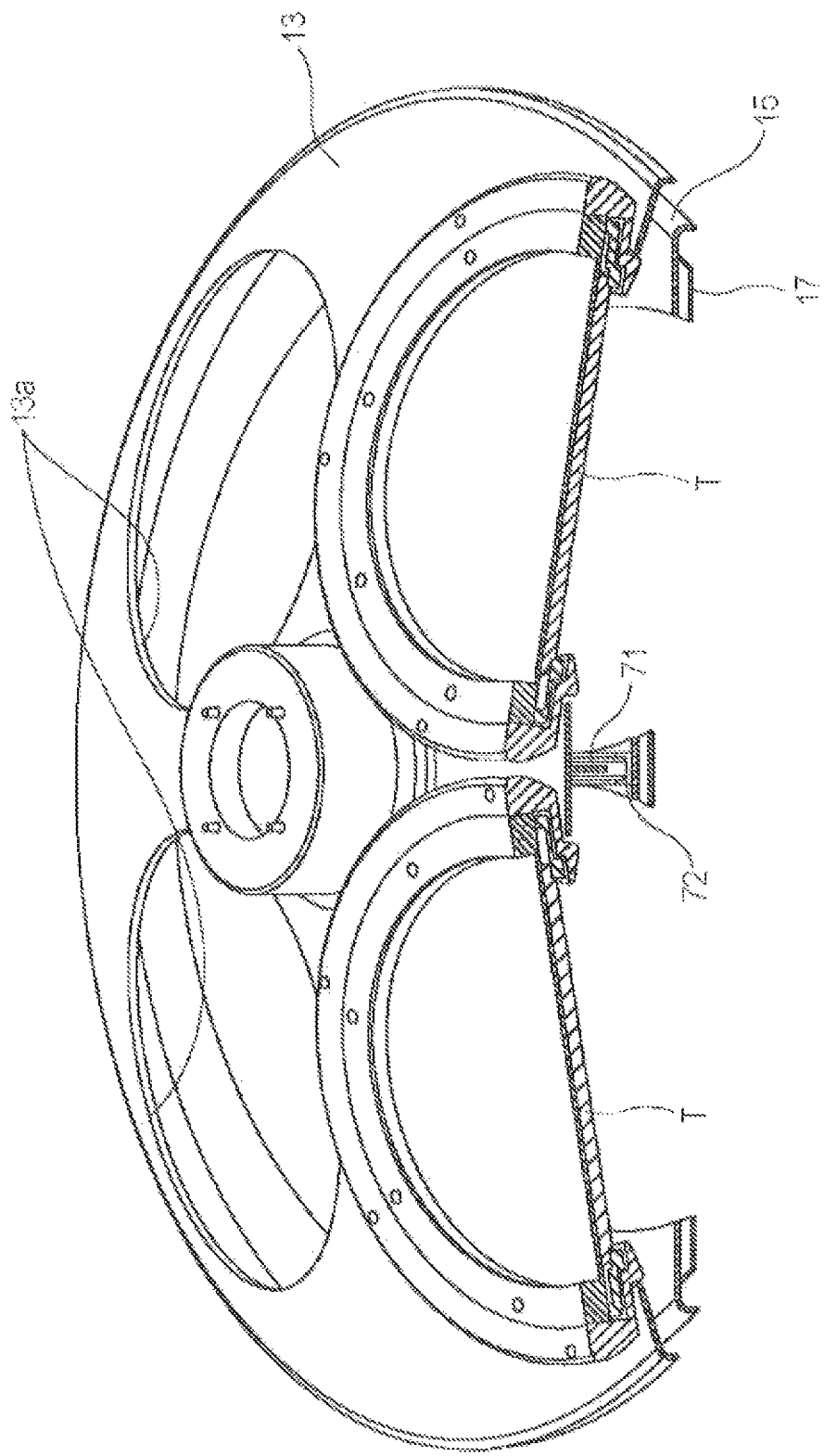
FIG. 5 depicts a perspective view of the shutter apparatus according to the first embodiment of the present invention.

A characteristic configuration of the present embodiment will be described with reference to FIGS. 4A to 6. FIG. 4A is a cross-sectional view through the shutter apparatus 4 taken along the line I-I of FIG. 3, and FIG. 4B is a cross-sectional view through the shutter apparatus 4 taken along the line II-II of FIG. 3. FIG. 5 is a perspective view (perspective cross-sectional view) of the shutter apparatus 4, including a cross section through the shutter apparatus 4 taken along the line II-II, and FIG. 6 is a cross-sectional view of a formed indirect path portion. In FIGS. 4 and 5, a given target electrode selected from among the target electrodes 35 to 38 is indicated by reference character C, and a given target is indicated by reference character T (T1 to T4). For the sake of simplifying the description, the target electrode holder 61, the upper shield plate 13, the first shutter plate 15 and the second shutter plate 17 are illustrated assuming that they are all configured to be parallel to each other.

FIG. 4A shows an arrangement of the first shutter plate 15 and the second shutter plate 17 when only one of the targets T that is located on the left is used in sputter film formation. Specifically, at a position opposing one of the targets T is an opening 15*a* or the first shutter plate 15, and a position opposing the other target T is closed by the first shutter plate 15. The openings 17*a* are opened on the second shutter plate 17 at positions that respectively oppose the targets T.

The positions where the first shutter plate 15 driven by the second driving apparatus 22 can be located in up and down directions include a rotatable position (lower position, or in other words, a position close to the substrate holder 3) and a non-rotatable position (upper position, or in other words, a position close to the shield plate 63). In a state in which the first shutter plate 15 is disposed in the rotatable position (lower position), even when the first shutter plate 15 is rotated, the separating portion 71 and the separating portion 72 do not come into contact with each other, and thus the first shutter plate 15 can take any rotation position. On the other hand, in a state in which the first shutter plate 15 is disposed in the non-rotatable position (upper position), when the first shutter plate 15 is rotated, the separating portion comes into contact with the separating portion 71, and thus the first shutter plate 15 is not allowed to rotate.

FIGS. 4A, 4B and 5 show a state in which the first shutter plate 15 and the second shutter plate 17 are disposed in the rotatable position (the position close to the substrate holder), and the separating portion 71 and the separating portion 72 are spaced apart from each other by a predetermined distance or more. The predetermined distance refers to a positional relationship in which the separating portion 71 and the separating portion 72 are spaced apart from each other in up and down directions (in which the separating portion 71 and the separating portion 72 can be moved toward and away from each other), and thus a passage 73, which will be described later, is not formed.

However, as shown in FIG. 6, when the first shutter plate 15 has been moved to the non-rotatable position (the position close to the upper shield plate 63), the leading end of the protruding portion constituting the separation 71 is inserted into the gap between the double protruding portions 72a included in the separating portion 72, and thereby an indirect path as formed by the separating portion 71 and the separating portion 72. That is, with the indirect path formed by the separating portion 71 and the separating portion 72, it is possible to reduce occurrence of a situation in which the atoms sputtered from a single target T pass through the gap between the upper shield plate 13 and the first shutter plate 15 and reach the other target T.

A description of the indirect path will now be given with reference to FIG. 6. The indirect path refers to a gap that is formed between the separating portion 72 and the separating portion 71 and has at least one bent portion. For example, a passage 73 through which sputtered particles cannot pass unless the particles move in a direction parallel to the rotation shaft of the shutter plate when passing therethrough forms an indirect path. In other words, when sputtered particles are prevented from moving straight forward when passing through a gap between the separating portion 72 and the separating portion 71, the gap constitutes an indirect path. In one example, the passage 73 can have a width 73W of 1 mm. The effect of preventing passage of sputtered particles becomes higher as the width 73W of the passage 73 decreases or as a distance 73L of the passage 73 increases.

In the indirect path portion, the space through which the particles can pass is narrow, and thus it is difficult for the sputtered particles to move beyond the indirect path portion. Also, the indirect path does not necessarily have a complex structure. It is also understood that in the case where a separating portion 71 and a separating portion 72, which are both member shaving a simple protruding shape or plate-like shape, are disposed in close proximity to each other, thereby forming a gap therebetween that constitutes a portion that prevents passage of sputtered particles, this case is also interpreted as "the indirect path is formed".

In order for an indirect path to be formed by the separating portion 71 and the separating portion 72, the rotation position needs to be controlled when the first shutter plate 15 is raised (closed position). In the present embodiment, in order to detect the rotation position of the first shutter plate 15, the rotation angle of the first shutter plate 15 at a position at which the marks 80a and 80b match with each other (see FIG. 3) is detected, and the detected position is stored, as the reference position, in the controller of the first driving apparatus 21 driving the first shutter plate 15. For example, the rotation angle of the first shutter plate 15 can be detected by using a motor having a function of detecting the rotation angle as the motor of the first driving apparatus 21 driving the first shutter plate 15.

In order to form an indirect path, it is desirable that the separating portion 71 and the separating portion 72 are in a positional relationship in which they do not come into contact with each other. This is because particle generation may occur as a result of the separating portion 71 and the separating portion 72 coming into contact with each other. In the present embodiment, the gap between the double protruding portions 72a of the separating portion 72 is formed so as to have a dimension greater than the thickness of the protruding portion of the separating portion 71. Also, the position of the first shutter plate 15 in up and down directions is set such that the leading end of the protruding portion constituting a separating portion 71 does not come into contact with the bottom portion 72b between the double protruding portions 71a included in a separating portion 72 when an indirect path is formed.

With the present embodiment, an indirect path can be formed in the gap between the upper shield plate 13 and the first shutter plate 15 by the separating portion 71 and the separating portion 72. Accordingly, it is possible to effectively prevent the atoms sputtered from a single target T from passing through the gap between the upper shield plate 13 and the first shutter plate 15 and reaching the other target T (contamination).

The above-described indirect path formed by the separating portion 71 and the separating portion 71 is formed between the upper shield plate 13 and the first shutter plate 15, and therefore the occurrence of contamination between adjacent targets can also be prevented with a configuration excluding the second shutter plate 17 from the shutter apparatus 4.

The structures of the separating portion 71 and the separating portion 72 are not limited to those described in the present embodiment as long as it is possible to prevent movement of the particles. For example, it is of course possible to reverse the arrangement of the separating portion 72 and the separating portion 71. Also, the separating portion 72 and the separating portion 71 may be replaced by two U-shaped members formed such that their openings fit into each other when the first shutter plate 15 is raised.

Furthermore, the separating portion 72 and the separating portion 71 may be replaced by two protruding portions that can form a gap serving as an indirect path when the first shutter plate 15 is raised. In the case where the separating portion 72 and the separating portion 71 are replaced by two protruding portions, it is desirable that a gap extending in a direction parallel to the rotation shaft of the first shutter plate 15 is formed when the first shutter plate 15 is raised.

Second Embodiment

Figure 7A:
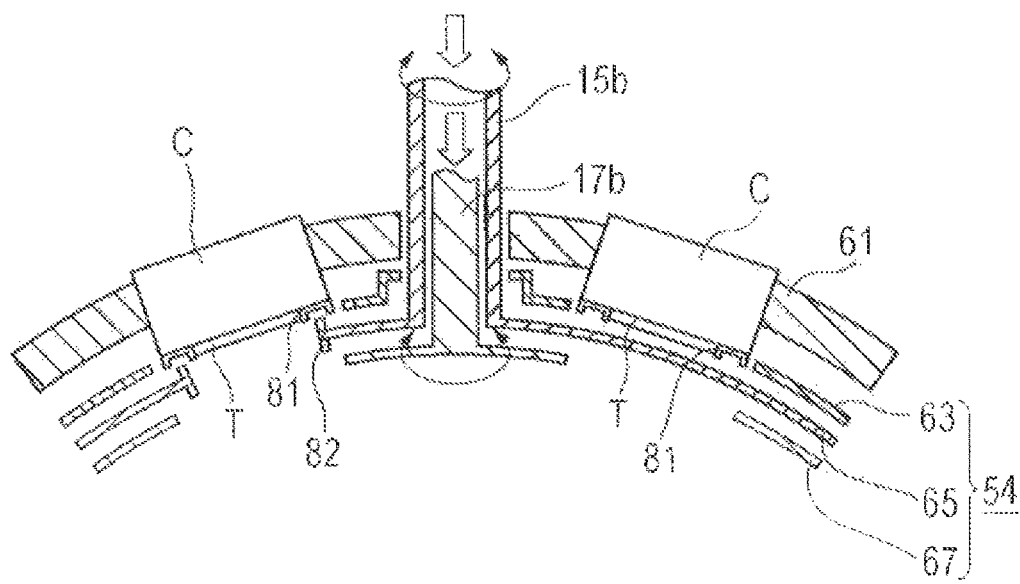
FIG. 7A depicts a cross-sectional view of a shutter apparatus according to a second embodiment of the present invention.
Figure 7B:
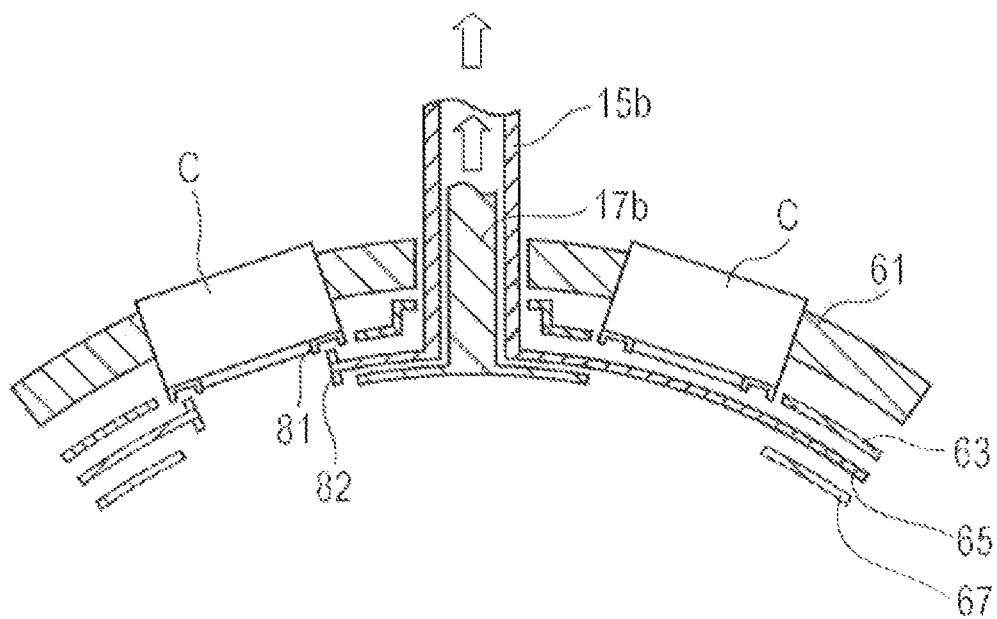
FIG. 7B depicts a cross-sectional view of the shutter apparatus according to the second embodiment of the present invention.
Figure 8:
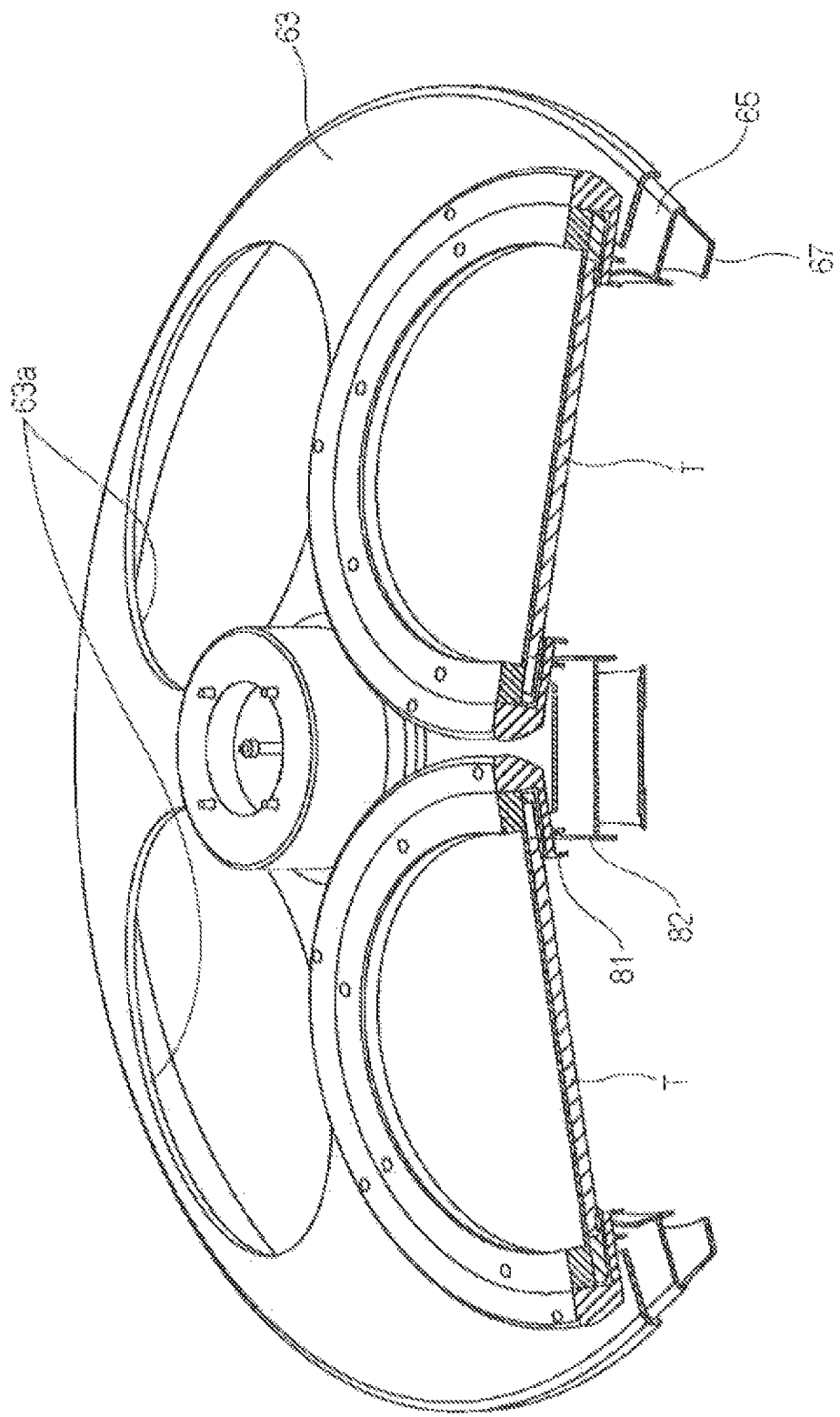
FIG. 8 depicts a perspective view of the shutter apparatus according to the second embodiment of the present invention.

A film-forming apparatus according to a second embodiment of the present invention will be described with reference to FIGS. 7A, 7B and 8. FIG. 7A is a cross-sectional view through a shutter apparatus 54 taken along the line corresponding to the line I-I of FIG. 3, and FIG. 7B is a cross-sectional view through the shutter apparatus 54 taken along the line corresponding to the line II-II of FIG. 3. FIG. 8 is a perspective view (perspective cross-sectional view) of the shutter apparatus 54, including a cross section through the shutter apparatus 54 taken along the line corresponding to the line II-II. The same reference numerals are given to members, arrangements and the like that are the same as those of the first embodiment, and descriptions thereof are omitted here.

In the shutter apparatus 64 of the present embodiment, separating portions 82 each including a protruding portion are provided on the first shutter plate (first shutter member) 65, and separating portions 81 (second protruding portions) each including a U-shaped portion are provided on the target electrode holder 61 side. The separating portions 82 including a protruding portion also extend to the second shutter plate (second shutter member) 67. Specifically, in the present embodiment, each separating portion 81 including a U-shaped portion is formed in a portion surrounding the target T of a target electrode C. In the present embodiment, the second shutter plate 67 can be raised relative to the first shutter plate 65.

When the first shutter plate 65 is raised, each separating portion 62 including a protruding portion provided to the first shutter plate 65 is inserted into the gap of the corresponding separating portion 81 including a U-shaped portion, thereby forming an indirect path. Likewise, when the second shutter plate 67 is raised relative to the first shutter plate 65, the lower end portion of each separating portion 82 including a protruding portion extending to the second shutter plate 67 of the first shutter plate 65 is inserted into the opening 17a of the second shutter plate 67. Accordingly, it is possible to reduce occurrence of a situation in which the particles sputtered from a target T enter the space between the first shutter plate 65 and the second shutter plate 67.

The separating portions 81 may be formed on a shield plate attached to the cathode electrodes T. This reduces a situation in which the particles that can cause contamination enter the upper side of the first shutter plate 65, and effectively prevents contamination even when the upper shield plate 63 is omitted. Also, the separating portions 82 extended downward reduce occurrence of a situation in which the particles enter the gap between the first shutter plate 65 and the second shutter plate 67. Furthermore, the range over which the particles spread is narrow, resulting in ease of maintenance.

Third Embodiment

Figure 9A:
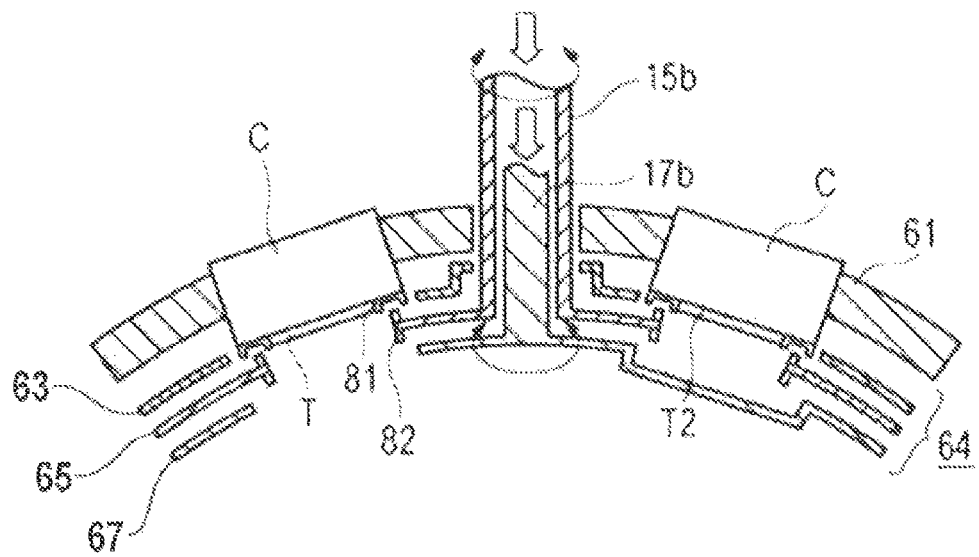
FIG. 9A depicts a cross-sectional view of a shutter apparatus according to a third embodiment of the present invention.
Figure 9B:
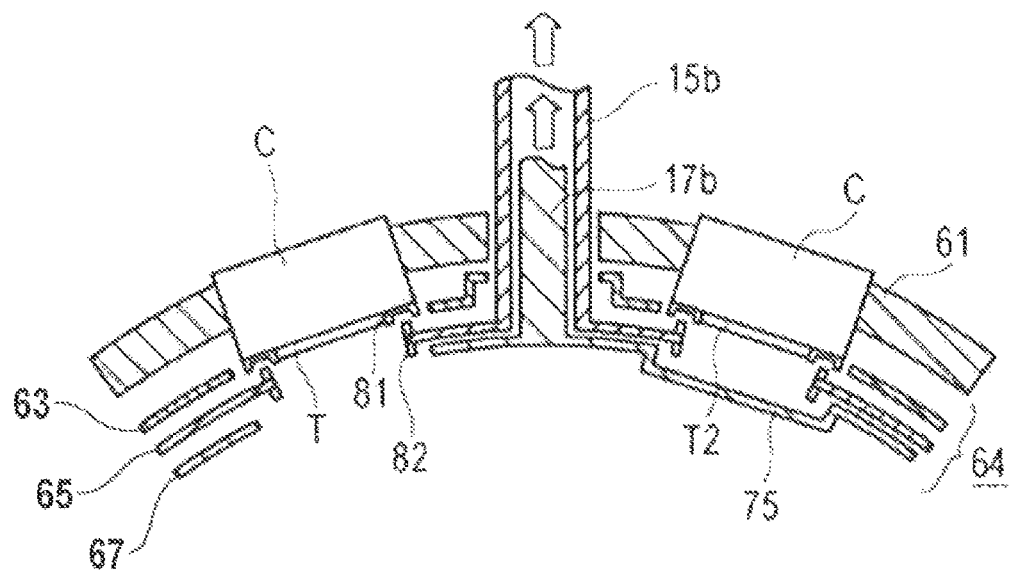
FIG. 9B depicts a cross-sectional view of the shutter apparatus according to the third embodiment of the present invention.

A film-forming apparatus according to a third embodiment of the present invention will be described with reference to FIGS. 9A and 9B. FIG. 9A is a cross-sectional view through a shutter apparatus 64 taken along the line corresponding to the line I-I of FIG. 3, and FIG. 9B is a cross-sectional view through the shutter apparatus 64 taken along the line corresponding to the line II-II of FIG. 3. The same reference numerals are given to members, arrangements and the like that are the same as those of the first embodiment, and descriptions thereof are omitted here. In the shutter apparatus 64 of the present embodiment, a lid member 75 is attached to a part of a plurality of openings of the second shutter plate 67.

When the second shutter plate 67 is raised relative to the first shutter plate 65, the opening on the substrate holder side of a target T2 not to be used can be closed by the lid member 75. This reduces a situation in which the particles traveling from the space on the substrate holder-side adhere to the target T2. With the present embodiment, it is possible to not only reduce occurrence of a situation in which the particles enter the upper side of the first shutter plate 65 or the gap between the first shutter plate 65 and the second shutter plate 67, but also prevent the particles coming from the substrate holder side from adhering to the target T2. For this reason, the effect of presenting contamination is very high.

The present invention is not limited to the above-described embodiments, and various changes and modifications can be made within the spirit, and scope of the present invention. Therefore, to apprise the public of the scope of the present invention, the following claims are made.

DESCRIPTION OF THE REFERENCE NUMERALS

T, T2 Target
GV Gate Valve
W Substrate
1 Film-Forming Apparatus
3 Substrate Holder
4, 54, 64 Shutter Apparatus
13, 63 Upper Shield Plate (Shield Member)
15, 65 First Shutter Flare (First Shutter Members)
17, 67 Second Shutter Plate (Second Shutter Member)
21 First Driving Apparatus
22 Second Driving Apparatus
35 to 38, C Target Electrode
51 Container
52 Ceiling Portion
61 Target Electrode Holder
63a, 66a, 67a Opening
71, 81 Separating Portion
72, 82 Separating Portion
75 Lid member

What is claimed is:

1. A film-forming apparatus comprising:
a plurality of target electrodes respectively having attachment surfaces to which targets can be attached;
a substrate holder configured to hold a substrate at a position opposing the plurality of target electrodes;
a first shutter member rotatably provided between the plurality of target electrodes and the substrate holder and having a plurality of openings that oppose the attachment surfaces when the first shutter member is rotated;
a first separating portion disposed between the openings of the first shutter member on one of two surfaces of the first shutter member that is on the target electrode side; and
a second separating portion disposed between the first shutter member and the target electrodes,
wherein the first shutter member is driven so as to bring the first separating portion and the second separating portion toward each other so that an indirect path can be formed between the first separating portion and the second separating portion, and driven so as to bring the first separating portion and the second separating portion away from each other so that the first shutter plate can be rotated.

2. The apparatus according to claim 1, further comprising a shield member provided between the plurality of target electrodes and the first shutter member,
wherein the shield member has a number of openings equal to the number of the target electrodes, and
the second separating portion is disposed between the openings of the shield member.

3. The apparatus according to claim 1, further comprising a second shutter member rotatably provided between the first shutter member and the substrate holder,
wherein the second shutter member has openings that oppose the openings of the first shutter member when the first shutter member or the second shutter member is rotated.

4. The apparatus according to claim 3, further comprising a lid member that can be attached to the opening of the second shutter member.

5. The apparatus according to claim 1,
wherein the first separating portion and the second separating portion both include a protruding portion, and in a state in which the indirect path has been formed, the protruding portion of the first separating portion and the protruding portion of the second separating portion form a passage extending along a direction parallel to a rotation shaft of the first shutter plate.

6. The apparatus according to claim 1,
wherein one of the first separating portion and the second separating portion includes two protruding portions and a bottom portion sandwiched by the two protruding portions, and
the other one of the first separating portion and the second separating portion includes a protruding portion that is inserted between the two protruding portions when the indirect path is formed.

* * * * *